(12) United States Patent
Lu et al.

(10) Patent No.: US 11,643,599 B2
(45) Date of Patent: May 9, 2023

(54) TUNGSTEN CHEMICAL MECHANICAL POLISHING FOR REDUCED OXIDE EROSION

(71) Applicant: Versum Materials US, LLC, Tempe, AZ (US)

(72) Inventors: Chun Lu, Phoenix, AZ (US); Xiaobo Shi, Chandler, AZ (US); Dnyanesh Chandrakant Tamboli, Chandler, AZ (US); Reinaldo Mario Machado, Phoenix, AZ (US); Mark Leonard O'Neill, Queen Creek, AZ (US); Matthias Stender, Phoenix, AZ (US)

(73) Assignee: VERSUM MATERIALS US, LLC, Tempe, AZ (US)

( * ) Notice: Subject to any disclaimer, the term of this patent is extended or adjusted under 35 U.S.C. 154(b) by 0 days.

(21) Appl. No.: 16/510,286

(22) Filed: Jul. 12, 2019

(65) Prior Publication Data
US 2020/0024515 A1   Jan. 23, 2020

Related U.S. Application Data

(60) Provisional application No. 62/700,948, filed on Jul. 20, 2018.

(51) Int. Cl.
| | |
|---|---|
| *C09K 13/02* | (2006.01) |
| *C09G 1/02* | (2006.01) |
| *C09K 13/00* | (2006.01) |
| *H01L 21/321* | (2006.01) |
| *H01L 21/768* | (2006.01) |

(52) U.S. Cl.
CPC ............. *C09K 13/02* (2013.01); *C09G 1/02* (2013.01); *C09K 13/00* (2013.01); *H01L 21/3212* (2013.01); *H01L 21/7684* (2013.01)

(58) Field of Classification Search
CPC .......... C09K 13/00; C09K 13/02; C09G 1/02; H01L 21/3212; H01L 21/7684
See application file for complete search history.

(56) References Cited

U.S. PATENT DOCUMENTS

| | | | |
|---|---|---|---|
| 4,789,648 A | 12/1988 | Chow et al. | |
| 9,631,122 B1* | 4/2017 | Dockery | ............... B24B 37/24 |
| 2004/0152309 A1 | 8/2004 | Carter et al. | |
| 2004/0244911 A1* | 12/2004 | Lee | ........................ C09G 1/02 |
| | | | 257/E21.304 |

(Continued)

FOREIGN PATENT DOCUMENTS

| | | |
|---|---|---|
| EP | 2357059 A2 | 8/2011 |
| KR | 20100071392 A | 6/2010 |

(Continued)

OTHER PUBLICATIONS

Yagishita, A., et al., IEEE Transactions on Electron Devices, vol. 47, No. 5, May 2000.

*Primary Examiner* — Shamim Ahmed
(74) *Attorney, Agent, or Firm* — Lina Yang

(57) ABSTRACT

This invention pertains to slurries, methods and systems that can be used in chemical mechanical planarization (CMP) of tungsten containing semiconductor device. Using the CMP slurries with additives to counter lowering of pH by tungsten polishing byproducts and maintain pH 4 or higher, the erosion of dense metal (such as tungsten) structures can be greatly diminished.

16 Claims, 3 Drawing Sheets

(56) References Cited

U.S. PATENT DOCUMENTS

| | | | |
|---|---|---|---|
| 2009/0133716 A1* | 5/2009 | Lee | C11D 11/0047 |
| | | | 134/3 |
| 2010/0197201 A1* | 8/2010 | Nomura | H01L 21/3212 |
| | | | 451/36 |
| 2010/0252774 A1* | 10/2010 | Shida | C09K 3/1463 |
| | | | 252/79.1 |
| 2014/0315386 A1* | 10/2014 | Zhou | C09G 1/02 |
| | | | 438/693 |
| 2015/0259804 A1 | 9/2015 | Lin et al. | |
| 2016/0122590 A1* | 5/2016 | Lew | C23F 3/04 |
| | | | 438/693 |
| 2016/0237315 A1 | 8/2016 | Stender et al. | |
| 2017/0190936 A1* | 7/2017 | Dockery | C09G 1/04 |
| 2018/0057710 A1* | 3/2018 | Yasui | C09G 1/02 |
| 2018/0355213 A1* | 12/2018 | Park | H01L 21/28123 |
| 2019/0085209 A1* | 3/2019 | Dockery | C09G 1/00 |

FOREIGN PATENT DOCUMENTS

| | | |
|---|---|---|
| WO | 9905706 | 2/1999 |
| WO | 2018058395 A1 | 4/2018 |

* cited by examiner

TUNGSTEN CHEMICAL MECHANICAL POLISHING FOR REDUCED OXIDE EROSION

CROSS REFERENCE TO RELATED APPLICATIONS

This application claims priority to U.S. provisional applications 62/700,948 filed on Jul. 20, 2018, the entire contents of which is incorporated herein by reference thereto for all allowable purposes.

BACKGROUND

This invention pertains to slurries (compositions or formulations), systems and methods used for Chemical Mechanical Polishing or Planarization (CMP) of semiconductor devices, particularly for materials containing tungsten.

Integrated circuits are interconnected through the use of well-known multilevel interconnections. Interconnection structures normally have a first layer of metallization, an interconnection layer, a second level of metallization, and typically third and subsequent levels of metallization. Inter-level dielectric materials such as silicon dioxide and sometimes low-k materials are used to electrically isolate the different levels of metallization in a silicon substrate or well. The electrical connections between different interconnection levels are made through the use of metallized vias and in particular tungsten vias. U.S. Pat. No. 4,789,648 describes a method for preparing multiple metallized layers and metallized vias in insulator films. In a similar manner, metal contacts are used to form electrical connections between interconnection levels and devices formed in a well. The metal vias and contacts are generally filled with tungsten and generally employ an adhesion layer such as titanium nitride (TiN) and/or titanium to adhere a metal layer such as a tungsten metal layer to the dielectric material.

In one semiconductor manufacturing process, metallized vias or contacts are formed by a blanket tungsten deposition followed by a CMP step. In a typical process, via holes are etched through the interlevel dielectric (ILD) to interconnection lines or to a semiconductor substrate. Next, a thin adhesion layer such as titanium nitride and/or titanium is generally formed over the ILD and is directed into the etched via hole. Then, a tungsten film is blanket deposited over the adhesion layer and into the via. The deposition is continued until the via hole is filled with tungsten. Finally, the excess tungsten is removed by CMP to form metal vias.

In another semiconductor manufacturing process, tungsten is used as a gate electrode material in the transistor because of its superior electrical characteristics over polysilicon which has been traditionally used as gate electrode material, as taught by A. Yagishita et al, IEEE TRANSACTIONS ON ELECTRON DEVICES, VOL. 47, NO. 5, May 2000.

In a typical CMP process, the substrate is placed in direct contact with a rotating polishing pad. A carrier applies pressure against the backside of the substrate. During the polishing process, the pad and table are rotated while a downward force is maintained against the substrate back. An abrasive and chemically reactive solution, commonly referred to as a polishing "slurry", a polishing "composition" or a polishing "formulation", is deposited onto the pad during polishing, where rotation and/or movement of the pad relative to the wafer brings said slurry into the space between the polishing pad and the substrate surface. The slurry initiates the polishing process by chemically reacting with the film being polished. The polishing process is facilitated by the rotational movement of the pad relative to the substrate as slurry is provided to the wafer/pad interface. Polishing is continued in this manner until the desired film on the insulator is removed. Removal of tungsten in the CMP is believed to be due to synergy between mechanical abrasion and tungsten oxidation followed by dissolution.

One of the commonly encountered problems in CMP in particular in metal applications such as tungsten are dishing of tungsten lines and erosion of arrays of metal lines. Tungsten CMP slurries have to be formulated such that the erosion can be minimized in order to meet certain design targets critical for a functioning device.

There still has been a need for novel CMP slurries, tungsten slurries that can reduce erosion while maintain desirable removal rate in polishing.

SUMMARY

The present invention relates to CMP slurries (compositions or formulations are used interchangeably), system and method of using the CMP slurries to reduce dishing while maintain desirable removal rate in polishing semiconductor device or substrate. More specifically, the present invention relates to CMP slurries, system and method of using the CMP slurries to reduce erosion while maintain desirable removal rate in polishing semiconductor device or substrate that containing tungsten.

The CMP slurries to polish tungsten surface comprise abrasive, one or more oxidizing agent, and an erosion reduce agent with pH of the slurries between 2 and 14, preferably between 4 and 12, and more preferably between 6 and 11 after the addition of 0.0001 wt. % to 2 wt. % tungsten(W) into the slurries. The tungsten(W) can be W powder, tungsten compounds or tungsten polishing byproducts. The weight percent is relative to the polishing slurry. The pH is the stabilized pH tested after adding the W into the slurries.

As an example, 0.5 gm tungsten powder is dissolved in the 100 gm polishing slurry at room temperature in the ratio of 0.5 gm of tungsten powder to 100 gm of polishing slurry. The stabilized pH measured 1 hour after tungsten powder addition is between 2 and 14, preferably between 4 and 12, and more preferably between 6 and 11.

Typically, stabilization of pH (wherein the change in pH with time is less than 0.5 units over a period of ½ hour) occurs after ½ hour after tungsten powder addition.

In certain preferred embodiments CMP abrasive comprise one or more oxidizing agent, activator or catalyst, pH adjusting agent, an erosion reduce agent, and remaining being water. The pH of the slurry is between 2 and 14, preferably between 4 and 12, and more preferably between 6 and 11 after the addition of 0.0001 wt. % to 2 wt. % tungsten(W), such as W powder or W residuals. The weight % is relative to the polishing slurry. The pH is the stabilized pH after the adding of the W powder.

As an example, 0.5 gm tungsten powder is dissolved in the 100 gm polishing slurry at room temperature in the ratio of 0.5 gm of tungsten powder to 100 gm of polishing slurry. The pH measured 1 hour after tungsten powder addition is between 4 and 11, or preferably between 5 and 11 or more preferably between 6 and 11.

In certain preferred embodiments CMP slurries comprise abrasive particles, one or more oxidizing agents, activator or catalyst, pH adjusting agent, an erosion reduce agent, and water, wherein the pH of the slurry is preferably greater than 3, or more preferably greater than 4 or most preferably greater than 6 after the addition of 0.0001 wt. % to 2 wt. % tungsten(W), such as W powder or W residuals. The weight percent is relative to the polishing slurry. The pH is the stabilized pH after the adding of W.

As an example, 0.5 gm tungsten powder is dissolved in the 100 gm polishing slurry at room temperature in the ratio of 0.5 gm of tungsten powder to 100 gm of polishing slurry. The stabilized pH measured 1 hour after tungsten powder addition is greater than 3 or more preferably greater than 4 or most preferably greater than 6.

In one aspect, described herein is a tungsten chemical mechanical polishing (CMP) polishing composition for reduced oxide erosion, comprising:
- an abrasive;
- at least one oxidizing agent;
- an activator or catalyst;
- an erosion reducing agent having at least one functional group with pKa equal and greater than 3, or preferably equal and greater than 4, or more preferably equal and greater than 5; and liquid carrier such as water;
- optionally one or more of:
- a pH adjusting agent;
- biocide;
- surfactants;
- stabilizing and passivating agents;
- dispersion agents;
- chelators;
- film-forming anticorrosion agents;
- dishing reducing agents; and
- a polish enhancement agent;
- wherein the chemical mechanical polishing (CMP) polishing composition having a pH from 1 to 14, preferably 5 to 12, and more preferably 7 to 11 and wherein when 0.5 gm of tungsten powder is added to the slurry, the pH after 1 hour is greater than or equal to 4, or preferably greater than or equal to 5 or more preferably greater than or equal to 6.

In another aspect, described herein is a system for chemical mechanical polishing a semiconductor substrate having tungsten(W) film and at least one second material with reduced erosion oxide, comprising:
- the semiconductor substrate;
- a polishing pad;
- a chemical mechanical polishing composition comprising
  - an abrasive;
  - at least one oxidizing agent;
  - an activator or catalyst;
  - an erosion reducing agent having at least one functional group with pKa equal and greater than 3, or preferably equal and greater than 4, or more preferably equal and greater than 5; and
  - liquid carrier such as water;
  - optionally one or more of:
  - a pH adjusting agent;
  - biocide;
  - surfactants;
  - stabilizing and passivating agents;
  - dispersion agents;
  - chelators;
  - film-forming anticorrosion agents;
  - dishing reducing agents; and
  - a polish enhancement agent;
  - wherein the chemical mechanical polishing (CMP) polishing composition having a pH from 1 to 14, preferably 5 to 12, and more preferably 7 to 11;

wherein
at least a portion of tungsten(W) film and a portion of the at least one second material are in contact with both the polishing pad and the chemical mechanical polishing composition.

In yet another aspect, described herein is a polishing method of reducing erosion oxide for chemical mechanical polishing a semiconductor substrate having tungsten(W) film and at least one second material;
comprising:
providing the semiconductor substrate;
providing a polishing pad;
providing a chemical mechanical polishing composition comprising
- an abrasive;
- at least one oxidizing agent;
- an activator or catalyst; an erosion reducing agent having at least one functional group with pKa equal and greater than 3, or preferably equal and greater than 4, or more preferably equal and greater than 5; and liquid carrier such as water;
- optionally one or more of:
- a pH adjusting agent;
- biocide;
- surfactants;
- stabilizing and passivating agents;
- dispersion agents;
- chelators;
- film-forming anticorrosion agents;
- dishing reducing agents; and
- a polish enhancement agent;
- wherein the chemical mechanical polishing (CMP) polishing composition having a pH from 1 to 14, preferably 5 to 12, and more preferably 7 to 11;
and
polishing the semiconductor substrate to selectively remove W film;
wherein
at least a portion of W film and a portion of the at least one second material are in contact with both the polishing pad and the chemical mechanical polishing composition; and ratio of removal rate of the first material to removal rate of the second material is greater than 1.

The second material can be a dielectric material includes but not limited to thermal oxide, Tetra Ethyl Ortho Silicate (TEOS), High Density Plasma (HDP) oxide, High Aspect Ratio Process (HARP) films, fluorinated oxide films, doped oxide films, organosilicate glass (OSG) low-K dielectric films, Spin-On Glass (SOG), polymer films, flowable Chemical Vapor Deposited (CVD), silicon nitride, silicon carbide, silicon oxy carbide, silicon oxy nitride, silicon oxy carbide nitride.

BRIEF DESCRIPTION OF THE DRAWINGS

The present invention will hereinafter be described in conjunction with the appended figures wherein like numerals denote like elements.

DETAILED DESCRIPTION

Formation of conducting metal features in semiconductor device wafer fabrication steps comprise patterning the wafer, etching line trenches or vias in the dielectric materials, filling those vias or line trenches with conducting metals and then performing chemical mechanical planarization (CMP) step to remove excess metal and provide a very planar surface. Critical CMP parameters that define the planarity of the polished wafers are dishing and erosion.

Dishing refers to the depression in an individual line or via relative to the field level. Dishing is primarily a significant issue for larger features (typically greater than 1 micron ($\mu$m)) and in low patterned density areas.

Erosion is the depression of an array of metal structures compared to the field level. Erosion is generally more problematic for dense arrays of narrow metallic structures with feature sizes 10 micron or less and patterned metal density of 50% or more.

Figure 1:
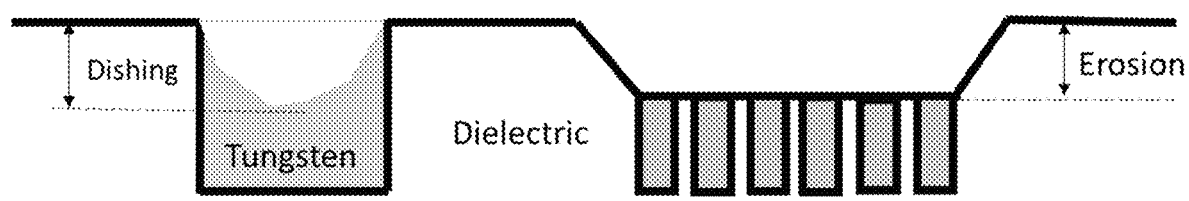
FIG. 1 shows schematic of dishing in individual line and erosion of an array of metal lines.

FIG. 1 shows representations of a dishing and erosion topography observed after CMP. (Elbe) et al, J. Electrochem Soc., Col. 145, No. 5, May 1998 pp. 1659-1664.)

Present invention pertains to slurries that can be used in chemical mechanical planarization (CMP) of tungsten containing semiconductor devices, substrates, or films. CMP slurries of present invention provide the unique result of reduced erosion of tungsten structures, while providing high removal rates, excellent colloidal stability and very low corrosion.

Tungsten film may be purely tungsten or may contain alloying elements.

Formulations of this invention may be suitable for many types of dielectric used in patterned structures. Examples of dielectric materials include but not limited to thermal oxide, Tetra Ethyl Ortho Silicate (TEOS), High Density Plasma (HDP) oxide, High Aspect Ratio Process (HARP) films, fluorinated oxide films, doped oxide films, organosilicate glass (OSG) low-K dielectric films, Spin-On Glass (SOG), polymer films, flowable Chemical Vapor Deposited (CVD), silicon nitride, silicon carbide, silicon oxy carbide, silicon oxy nitride, silicon oxy carbide nitride.

Formulations of this invention are especially useful for polishing dielectric materials which show high blanket removal rates with slurry having pH 3 or lower.

Preferably, under similar CMP processing conditions blanket dielectric removal rate is at least 2 times lower, or more preferably at least 3 times lower or most preferably at least 4 times lower when polished at CMP slurry at pH 7 compared to when blanket dielectric films are polished with CMP slurry formulation at pH 3 when formulations are otherwise similar. Formulations of this invention are particularly suitable for dielectrics comprising silicon oxide such as TEOS and HDP.

In a typical bulk tungsten metal CMP application, metal is polished at rates much higher compared to the dielectric materials. Lower the removal rates of the dielectric material, lower would be the array erosion since the dielectric between the two metal features would provide a strong resistance to erosion. As a result, it is often desirable to use formulations that provide very low dielectric polish rates, preferably less than 50 Å/min or more preferably less than 25 Å/min or most preferably less than 10 Å/min. For tungsten polishing slurries, lower dielectric blanket rate can be used by a combination of low abrasive particle concentration and slurry pH higher than 3, preferably higher than 5 or more preferably higher than 6.

However, even though the silicon oxide dielectric blanket films polish rates are very low, the erosion of the line arrays can still be very high in order of hundreds of angstroms.

Without being beholden to any particular theory, erosion is thought to be contributed by generation of tungsten byproducts of polishing that reduce the local pH of the slurry thereby increasing the silicon oxide dielectric polish rates. One of the possible byproducts is tungstic acid which is formed by dissolution of tungsten removed from the surface. Tungstic acid being an acid would lower the pH of the slurry as the polishing progresses. As a result, the polishing compositions that will be very effective for reducing the erosion would be those which can maintain the local pH level during polishing the patterned wafer and prevent acidification of slurry, so that the dielectric polish rates would be maintained low. Particularly useful additives for reducing erosion would therefore have sufficient capability to maintain pH at value greater than 4 or preferably greater than 5 or more preferably greater than 6 in the presence of tungsten polishing byproducts.

It can be calculated that when a 300 mm tungsten wafer is polished using a slurry with a flow rate of 100 ml/min, 0.5 gm of tungsten will be removed under a typical removal rate of 3700 Angstroms/min. Therefore dissolving 0.5 gm of tungsten powder in 100 gm of slurry may produce pH similar to what the wafer sees at the time of polishing.

The present invention discloses CMP slurries to polish tungsten surface comprise abrasive, one or more oxidizing agent with pH of the slurry is between 2 and 14, preferably is between 4 and 12, and more preferably is between 6 and 11 after the addition 0.5 wt. % tungsten(W). The weight percent is relative to the polishing slurry. The pH is measured 1 hour after the adding of the W powder. Tungsten powder when dissolved in the slurry is likely to generate pH conditions similar to the pH of the slurry during polishing conditions when the tungsten film is being polished and creating tungsten byproducts.

In certain preferred embodiments CMP slurries comprise abrasive particles, one or more oxidizing agents, activator, pH adjusting agent, and water wherein the pH of the slurry is preferably greater than 4, or preferably greater than 5 or more preferably greater than 6 after the addition of 0.0001 wt. % to 2 wt. % tungsten(W) such as W powder or W compounds or tungsten polishing byproducts. The weight percent is relative to the polishing slurry. The pH is the stabilized pH after the adding of the W powder.

As an example, 0.5 gm tungsten powder is dissolved in the 100 gm polishing slurry at room temperature in the ratio of 0.5 gm of tungsten powder to 100 gm of polishing slurry when pH is measured 1 hour after tungsten powder addition.

The CMP slurries may as optionally comprise surfactants; stabilizing and passivating agents; dispersion agents; chelators; film-forming anticorrosion agents; dishing reducing agents and a polish enhancement agent.

In certain preferred embodiments, the polish rates of tungsten blanket films at 4 psi downforce and 100 RPM table speed is greater than 1000 Å/min. or more preferably greater than 2000 Å/min. or most preferably greater than 3000 Å/min.

In certain preferred embodiments, the erosion of 9×1 micron array (9 micron wide tungsten line width separated by 1 micron wide dielectric line) measured on a patterned wafer is less than 500 Å or preferably less than 400 Å or more preferably less than 300 Å when the wafer is polished for 30 seconds additional time after the pattern wafer polish end point detected by using is suitable method such as eddy current measurement or optical end point detection.

Abrasive

The abrasive used in CMP slurries can be activator-containing particles (i.e., an abrasive having an activator coating); or non-activator-containing particles.

The abrasive is generally in the form of an abrasive particle, and typically many abrasive particles, of one material or a combination of different materials.

Generally, a suitable abrasive particle is more or less spherical and has an effective diameter of about 30 to about 300 nanometers (nm), although individual particle size may vary.

Particle size may be measured by any suitable technique including but not limited to Static Light Scattering, Dynamic Light Scattering, Hydrodynamic Fluid Fractionation, Sedimentation Analysis, Electrical Sensing Zone Analysis and Dynamic Image Analysis, disc centrifuge analysis. A preferred method for particle size and distribution measurement is dynamic light scattering.

Abrasive in the form of aggregated or agglomerated particles are preferably processed further to form individual abrasive particles.

A slurry may have more than one type of abrasive, and it may be advantageous to have different sizes for different types of abrasives.

Abrasive can be metal oxide, a metal oxide or metalloid oxide or a chemical mixture of metal oxides or metalloid oxides.

Suitable metal oxide abrasive includes, but is not limited to, alumina, ceria, germania, silica, spinel, titania, an oxide or nitride of tungsten, zirconia, or any of the above doped with one or more other minerals or elements, and any combination thereof. The metal oxide abrasive may be produced by any of a variety of techniques, including sol-gel, hydrothermal, hydrolytic, plasma, pyrogenic, aerogel, fuming and precipitation techniques, and any combination thereof.

Precipitated metal oxides and metalloid oxides can be obtained by known processes by reaction of metal salts and acids or other precipitating agents. Pyrogenic metal oxide and/or metalloid oxide particles are obtained by hydrolysis of a suitable, vaporizable starting material in an oxygen/hydrogen flame. An example is pyrogenic silicon dioxide from silicon tetrachloride. The pyrogenic oxides of aluminum oxide, titanium oxide, zirconium oxide, silicon dioxide, cerium oxide, germanium oxide and vanadium oxide and chemical and physical mixtures thereof are suitable.

The abrasive may be a mixed oxide such as consisting of the two molecular species $SiO_2$ and $Al_2O_3$. Abrasives comprising alumina coated silica can also be useful.

In one preferred embodiment, the metal oxide abrasive is a precipitated or fumed abrasive, and preferably a fumed abrasive. By way of example, a fumed metal oxide abrasive may be a fumed silica or fumed alumina or a fumed silica/alumina.

Silica is the preferred abrasive. The silica can be any of precipitated silica, fumed silica, silica fumed, pyrogenic silica, silica doped with one or more adjutants, or any other silica-based compound.

In an alternate embodiment the silica can be produced, for example, by a process selected from the group consisting of a sol-gel process, a hydrothermal process, a plasma process, a fuming process, a precipitation process, and any combination thereof.

The silica in one embodiment is advantageously at a particle size between about 2 and about 300 nanometers, for example between about 30 and about 250 nanometers or preferably between 50 nm and 180 nm.

Abrasive particles may be purified using suitable method such as ion exchange to remove metal impurities that may help improve the colloidal stability. Alternatively, high purity abrasive particles are used.

In general, the above-mentioned abrasives may be used either alone or in combination with one another. Two or more abrasive particles with different sizes may also be combined to obtain excellent performance.

In most embodiments of the present invention, the abrasive is selected from the group consisting of colloidal silica; fumed silica; alumina; titania; ceria; zirconia; surface modified particles selected from the group consisting of activator-containing particles, composite particles, and lattice doped and inorganic oxide particles; and combinations thereof.

The concentration of abrasive can range from 0.001 wt. % to 30 wt. %, the preferred is from about 0.01 wt. % to about 10 wt. %, the more preferred is from about 0.1 and 2 wt. %. The weight percent is relative to the composition.

Reducing Oxide Erosion

The CMP slurries of the present invention may comprise additives-erosion reducing agent that can reduce the erosion for tungsten polishing.

Suitable additives include chemicals when added to CMP slurries would keep the slurry pH greater than 4, preferably more than 5 or more preferably greater than 6 in the presence of byproducts of tungsten polishing.

Or, the pH of the slurry is preferably greater than 3, preferably greater than 4 or more preferably greater than 6 after the addition of 0.0001 wt. % to 2 wt. % tungsten(W) such as W powder or W residuals. The weight percent is relative to the polishing slurry. The pH is the stabilized pH after the adding of the W powder.

As an example, 0.5 gm tungsten powder is dissolved in the 100 gm polishing slurry at room temperature in the ratio of 0.5 gm of tungsten powder to 100 gm of polishing slurry when the pH is measured 1 hour after tungsten powder addition.

In certain preferred embodiments, the erosion reducing agent is a chemical with at least one functional group with pKa greater than 3, or preferably greater than 4, or more preferably greater than 5.

In some more preferred embodiments, the erosion reducing agent is a chemical with two or more functional groups with pKa greater than 3, or preferably greater than 4, or more preferably greater than 5.

Examples of erosion reducing agents include but not limited to ammonium hydroxide, potassium hydroxide, sodium hydroxide, cesium hydroxide, potassium silicate, quaternary ammonium hydroxide, primary amine compounds, secondary amine compounds, tertiary amine compounds, alcohol amines, polyacrylic acid, citric acid, acetic acid, carbonic acid, Tris, 4-(2-hydroxyethyl)-1-piperazineethanesulfonic acid, N-cyclohexyl-3-aminopropanesulfonic acid, 3-(N-morpholino)propanesulfonic acid, and piperazine-N,N'-bis(2-ethanesulfonic acid), taurine, acetic acid, glutamic acid, acrylic acid, malonic acid, propanoic acid, amino acids (such as glycine, bicine, tricine, serine, proline, cysteine), maleic acid, succinic acid, fumaric acid, tartaric acid, creatinine, asparagine, pyrollidone, morpholine, piperazine, pyridine, uric acid, itaconic acid, 2-oxoglutaric acid, picolinic acid, choline, pyridinecarboxylic acid, 3,4-Dihydroxybenzoic acid, polyamino carboxylic acids such as Nitrilotriacetic acid, Ethylenediaminetetraacetic acid(EDTA), diethylenetriaminepentaacetic acid, ethylene glycol-bis(β-aminoethyl ether)-N,N,N',N'-tetraacetic acid, iminodiacetic acid. Salts of acidic compounds may also be used.

Two or more compounds can be used together to maximize the erosion reduction.

In certain preferred embodiment a base may be used along with organic acid with at least one functional group with pKa>4.

Preferred additives are organic acid with at least one carboxylic acid group with pKa of 4 or higher. In some more preferred embodiments, additives comprise organic acids with at least two carboxylic acid groups with at least one carboxylic acid group having a pKa of 4 or higher.

Erosion reducing agent may be present in the concentration in the concentration of ≥0.01 wt. %, ≥0.05 wt. % or ≥0.1 wt. %; such as from 0.01 wt. % to 5 wt. %, from 0.05 wt. % to 2 wt. % or from 0.1 wt. % to 1 wt. %.

Additives for Dishing Reduction or Tungsten Corrosion Inhibition

Slurry formulation may comprise an additive to reduce dishing if tungsten features or to reduce tungsten etching and corrosion during CMP.

Additives used in the slurries include, but are not limited to sarcosinates, related carboxylic compounds, and hydrocarbon substituted sarcosinate; organic polymer and copolymer having molecules containing ethylene oxide repeating units, such as polyethylene oxide (PEO), and ethoxylated surfactants, nitrogen containing heterocycles without nitrogen-hydrogen bonds, sulfides, oxazolidines or mixtures of functional groups in one compound, nitrogen containing compounds having three or more carbon atoms that form alkylammonium ions, amino alkyls having three or more carbon atoms, Polymeric corrosion inhibitors comprising repeating group of at least one nitrogen-containing heterocyclic ring or a tertiary or quaternary nitrogen atom, polyacationic amine compounds, cyclodextrin compounds, polyethyleimine compounds, glycolic acid, chitosan, sugar alcohols, polysaccharides, alginate compounds, phosphonium compounds, sulfonic acid polymers.

The amount of these additives ranges from 1 ppm to 10,000 ppm, more preferred 10 ppm to 1000 ppm, and most preferred 50 to 500 ppm.

Oxidizer

The CMP slurries of the present invention comprise an oxidizer for chemical etching of material. The oxidizing agent of the CMP slurry is in a fluid composition which contacts the substrate and assists in the chemical removal of targeted material on the substrate surface. The oxidizing agent component is thus believed to enhance or increase the material removal rate of the composition. Preferably, the amount of oxidizing agent in the composition is sufficient to assist the chemical removal process, while being as low as possible to minimize handling, environmental, or similar or related issues, such as cost.

Advantageously, in one embodiment of this invention, the oxidizer is a component which will, upon exposure to at least one activator, produce free radicals giving an increased etching rate on at least selected structures. The free radicals described infra will oxidize most metals and will make the surface more susceptible to oxidation from other oxidizers. However, oxidizers are listed separately from the "Compound Producing Free Radicals", to be discussed infra, because some oxidizers do not readily form free radicals when exposed to the activators, and in some embodiments, it is advantageous to have one or more oxidizers which provide matched etching or preferential etching rates on a variety of combinations of metals which may be found on a substrate.

As is known in the art, some oxidizers are better suited for certain components than for other components. In some embodiments of this invention, the selectivity of the CMP system to one metal as opposed to another metal is maximized, as is known in the art. However, in certain embodiments of present invention, the combination of oxidizers is selected to provide substantially similar CMP rates (as opposed to simple etching rates) for a conductor and a barrier combination.

In one embodiment, the oxidizing agent is an inorganic or organic per-compound.

A per-compound is generally defined as a compound containing an element in its highest state of oxidation, such as perchloric acid; or a compound containing at least one peroxy group (—O—O—), such as peracetic acid and perchromic acid.

Suitable per-compounds containing at least one peroxy group include, but are not limited to, peracetic acid or salt thereof, a percarbonate, and an organic peroxide, such as benzoyl peroxide, urea hydrogen peroxide, and/or di-t-butyl peroxide.

Suitable per-compounds containing at least one peroxy group include peroxides. As used herein, the term "peroxides" encompasses R—O—O—R', where R and R' are each independently H, a $C_1$ to $C_6$ straight or branched alkyl, alkanol, carboxylic acid, ketone (for example), or amine, and each of the above can independently be substituted with one or more benzyl group (for example benzoyl peroxide) which may themselves be substituted with OH or $C_1$-$C_5$ alkyls, and salts and adducts thereof. This term therefore includes common examples such as hydrogen peroxide, peroxyformic acid, peracetic acid, propaneperoxoic acid, substituted or unsubstituted butaneperoxoic acid, hydroperoxy-acetaldehyde, Also encompassed in this term are common complexes of peroxides, for example urea peroxide.

Suitable per-compounds containing at least one peroxy group include persulfates. As used herein, the term "persulfates" encompasses monopersulfates, di-persulfates, and acids and salts and adducts thereof. Included for example is peroxydisulfates, peroxymonosulfuric acid and/or peroxymonosulfates, Caro's acid, including for example a salt such as potassium peroxymonosulfate, but preferably a non-metallic salt such as ammonium peroxymonosulfate.

Suitable per-compounds containing at least one peroxy group include perphosphates, defined as above and including peroxydiphosphates.

Also, ozone is a suitable oxidizing agent either alone or in combination with one or more other suitable oxidizing agents.

Suitable per-compounds that do not contain a peroxy group include, but are not limited to, periodic acid and/or any periodiate salt (hereafter "periodates"), perchloric acid and/or any perchlorate salt (hereafter "perchlorates") perbromic acid and/or any perbromate salt (hereafter "perbromates"), and perboric acid and/or any perborate salt (hereafter "perbromates").

Other oxidizing agents are also suitable components of the composition of the present invention. Iodates are useful oxidizers.

Two and more oxidizers may also be combined to obtain synergistic performance benefits.

The oxidizer concentration can range from 0.01 wt. % to 30 wt. % while the more preferred amount of oxidizing agents is from about 0.5 wt. % to about 10 wt. %. The weight percent is relative to the composition.

In most embodiments of the present invention, the oxidizer is selected from the group consisting of peroxy compound selected from the group consisting of hydrogen peroxide, urea peroxide, peroxyformic acid, peracetic acid, propaneperoxoic acid, substituted or unsubstituted butaneperoxoic acid, hydroperoxy-acetaldehyde, potassium periodate, ammonium peroxymonosulfate; and non-per-oxy compound selected from the group consisting of ferric nitrite, $KClO_4$, $KBrO_4$, $KMnO_4$.

Activator

The activator or catalyst is a material that facilitates the formation of free radicals by at least one free radical-producing compounds present in the fluid. If the activator is a metal ion, or metal-containing compound, it is in a thin layer associated with a surface of a solid which contacts the fluid. If the activator is a non-metal-containing substance, it can be dissolved in the fluid. It is preferred that the activator is present in amount that is sufficient to promote the desired For example, activators or catalysts of U.S. Pat. Nos. 7,014,669, 6,362,104, 5,958,288, 8,241,375, 7,887,115, 6,930,054, US patent application numbers US2014315386, US2016280962, and Korean publication number KR1020110036294, the disclosure of which are incorporated by reference, can be used in this capacity.

Activator can be present in the slurry or it can be present on the polishing pad or can be present where the slurry containing oxidizer contacts the activator prior to passing between the pad and a wafer substrate.

Activators may be present in one or more different forms. Examples of different forms of activators include but not limited to (i) soluble activator compound in the slurry (ii) particle with a surface modified with activator compound (iii) particles with activator included in the both the particle core and the surface (iv) core-shell composite particles comprising activator exposed on the surface.

In one embodiment, the activator is any metal-containing compound known to be useful in Fenton's reactions as an activator, wherein the oxidizer is a peroxide, particularly hydrogen peroxide. Transition metals like copper, manganese, cobalt, and cerium, as well as the more traditional iron and copper, are able to catalyze this reaction.

In one important embodiment, the activator comprises a metal-containing compound having the metal other than a metal of Group 4(b), Group 5(b) or Group 6(b) of the Periodic Table of Elements. In one embodiment, compounds of metals of Group 1(b) or Group 8 are preferred metal-containing activators.

Metal containing activator compounds can be used in form a soluble compound in the slurry. Suitable activator compounds for the pH range of this invention include but are not limited to are ammonium iron (III) oxalate trihydrate, iron(III) citrate tribasic monohydrate, iron(III) acetylacetonate and ethylenediamine tetraacetic acid, iron (III) sodium salt hydrate. A soluble activator can also be a metal compound of Ag, Co, Cr, Cu, Fe, Mo, Mn, Nb, Ni, Os, Pd, Ru, Sn, Ti, V and mixtures thereof having multiple oxidation states. In most embodiments of the present invention, the activator includes, but is not transition metals. Especially useful soluble activator compounds, are the compounds which are soluble and stable in slurry pH greater than 7. Some of the activator compounds such as ferric nitrate are not stable in alkaline pH and tend to precipitate. Compounds with strong chemical ligands such as citric acid, gluconic acid, oxalic acid, ethylene diamine tetra acetic acid, are generally for stable in alkaline pH and thus more suitable in the slurry formulation of this invention.

The amount of soluble activator compound in a slurry ranges from about 0.0005 wt. % to about 10 wt. %; preferably 0.001 wt. % to 2 wt. %, more preferably between 0.01 wt. % to 1 wt. %; most preferably between 0.05 wt. % to 0.5 wt. %.

In another important embodiment, the activator comprises any transition metal-containing compound that can react with a compound that produces free radicals, is associated with a solid. That is, the activators of the present invention are not soluble in the fluid. Activators can be associated with a particle. The particle may be an abrasive, or it may be a carrier for the activator. In some preferred embodiments the activator can be chemically or physically adsorbed on the surface of the abrasive as molecular species, small particles or as a monolayer or a partial layer. In some other embodiments, the abrasive can be a co-formed abrasive in which the activator is homogeneously mixed with another oxide to form solid particles containing an intimate mixture of the activator supported on metal oxide.

Iron associated with an abrasive is particularly useful and is the most preferred activator. Iron associated with silica is the most preferred system. The silica, with its numerous OH groups, can multiply bind with the iron, holding the iron firmly associated with the silica by a number of covalent and/or ionic type bonds. Yet, the plurality of bonds of iron onto the silica, be absorbed, adsorbed, or coated, allows easy transformation between oxidation states without the iron having a tendency to dis-associate from the silica surface. Surprisingly, iron associated with silica can be used at high pH values, for example from pH 5 to pH 7 and in some cases up to pH 12.

The iron can be associated with the abrasive in the form of a salt, for example a ferric salt, a ferrous salt, in some forms a ferric oxide, and in some forms metallic metal. Generally, metallic metal will be transformed to the ferric or ferrous form in the presence of oxidizers. An additional advantage of iron is that it is environmentally benign and does not pose significant disposal problems.

A system with iron activator, i.e., a slurry having iron coated on solid particles contained within the slurry, shows excellent free radical activity if the amount of activator iron is about 2 to 500 ppm total activator iron, preferably 3 to 100 ppm total activator iron, and for low iron embodiments about 4 to 20 ppm total activator iron.

Iron that is not contacting the fluid, including iron for example within a particle matrix where it cannot generate free radicals that can escape the particle structure, is not included in the term activator iron.

Iron that cannot activate the formation of free radicals, for example because it is incorporated within a matrix where changes between oxidation states is discouraged, is not included in activator iron.

Finally, iron that is chelated or otherwise not available for reaction with the compound that produces free radicals is not included as activator iron.

An exemplary slurry has about 10 ppm to about 300 ppm total activator iron, most of it absorbed, adsorbed, or coated onto the abrasive.

The particles comprising the activator compound may be used in CMP slurry in a concentration range of 0.01 wt. % to 2 wt. %, or preferably between 0.05 wt. % to 1 wt. %, or most preferably between 0.07 wt. % and 0.5 wt. %.

The activator may be a non-metal-containing compound. Iodine is a useful with for example hydrogen peroxide to form free radicals. The iodine may be present in an amount sufficient to create the desired free radical activity. In some embodiments, the iodine may be present in an amount ranging from about 1 ppm to about 5000 ppm, preferably between about 10 ppm and about 1000 ppm. Non-metallic activators are often synergistically combined with metal-containing activators Activator may also be a light-activated activators such as titanium oxides (and light used as an activator). The photoactivated materials of U.S. Pat. No. 6,362,104, the disclosure of which is incorporated by reference, can be used in this capacity.

The amount of activator in a slurry ranges from about 0.0005 wt. % to about 10 wt. %; preferably 0.001 wt. % to 2 wt. %, more preferably between 0.01 wt. % to 1 wt. %; most preferably between 0.05 wt. % to 0.5 wt. %.

pH Adjustors

The pH of the composition is desirably on the order of from about pH 1 to about pH 14, and preferably from about pH 5 to about pH 12, and more preferably from about pH 7 to about pH 11.

The pH of the composition may be adjusted using an appropriate pH adjusting agent, such as a suitable acid, base, amine, or any combination thereof. Preferably, a pH adjusting agent used in the composition does not contain metal ions, such that undesirable metal components are not introduced into the composition. Suitable pH adjusting agents include amines, ammonium hydroxide, nitric acid, phosphoric acid, sulfuric acid, organic acids, and/or salts thereof, and any combination thereof.

The amount of pH adjusting agent ranges from 0.0001 wt. % to 5 wt. %;

Promoters

As stated above, although metals having multiple oxidation states that are dissolved in the fluid contacting the substrate can act as oxidizers, the most preferred embodiments of this invention have substantially no metals having multiple oxidation states.

In some embodiments, compounds of Al, Ag, Ce, Co, Cr, Cu, Fe, Mo, Mn, Nb, Nd, Ni, Os, Pd, Pt, Rh, Ru, Sc, Sm, Ta, Ti, V, or W in minor amounts dissolved in the solution are useful. These are discussed in U.S. Pat. No. 5,958,288, the disclosure of which is incorporated herein by reference. Metal ions in solution are believed to act as oxidizers with a degree of affinity to the substrate, particularly to metal substrates. If they are able to be oxidized by other oxidizers in the fluid, there will be some synergistic action between the two. In most cases the promoters are believed not to facilitate the action of the free radicals, however. Compounds that form promoters on exposure to a catalyst or substrate, such as those compounds described in U.S. Pat. No. 5,863,838, the disclosure of which is incorporated by reference, are also useful.

In some embodiments of the present invention, the fluid composition contacting the substrate has a small amount of metal ion oxidizers, herein called promoters. Soluble compounds or salts of copper, aluminum, cerium, and iron are used as oxidizers or promoters in CMP solutions. If used, a preferred metal-containing oxidizer promoter is soluble cerium salts or aluminum salts.

The amount of promotor in a slurry ranges from about 0.0001 wt. % to about 1.0 wt. %; preferably 0.0005 wt. % to 0.5 wt. %, more preferably between 0.0025 wt % to 0.1 wt %.

Chelators

If no-(dissolved)-metal-containing embodiments are desired, the fluid may have chelators. Chelators can essentially trap and isolate metals having multiple oxidation states that are present in dissolved form in the fluid. If dissolved metals are in chelated form, this essentially isolates them from the substrate, which impairs their efficiency as a promoter but prevents metal ion contamination. This can extend the pot life of a slurry of oxidizer, however, and at low concentrations the chelators will not effectively impair the efficiency of the free radicals.

Therefore, only small amounts of chelator should be used. Chelators generally contain organic acid moieties, which can act as free radical quenchers. This could adversely affect the system performance.

In most embodiments of the present invention, the chelator includes, but is not limited to organic carboxylic acids, organic sulfonic acids, and organic phosphoric acids.

Generally, less than 3%, preferably less than 1%, for example less than 0.5% by weight of chelators are preferred.

Stabilizers

The composition may also include one or more of various optional additives. Suitable optional additives include stabilization agents. These optional additives are generally employed to facilitate or promote stabilization of the composition against settling, flocculation (including precipitation, aggregation or agglomeration of particles, and the like), and decomposition. Stabilizers can be used to extend the pot-life of the oxidizing agent(s), including compounds that produce free radicals, by isolating the activator material, by quenching free radicals, or by otherwise stabilizing the compounds that form free radicals.

Some materials are useful to stabilize hydrogen peroxide. One exception to the metal contamination is the presence of selected stabilizing metals such as tin. In some embodiments of this invention, tin can be present in small quantities, typically less than about 25 ppm, for example between about 3 and about 20 ppm. Similarly, zinc is often used as a stabilizer. In some embodiments of this invention, zinc can be present in small quantities, typically less than about 20 ppm, for example between about 1 and about 20 ppm. In another preferred embodiment the fluid composition contacting the substrate has less than 500 ppm, for example less than 100 ppm, of dissolved metals, except for tin and zinc, having multiple oxidation states. In the most preferred commercial embodiments of this invention, the fluid composition contacting the substrate has less than 9 ppm of dissolved metals having multiple oxidation states, for example less than 2 ppm of dissolved metals having multiple oxidation states, except for tin and zinc. In some preferred embodiments of this invention, the fluid composition contacting the substrate has less than 50 ppm, preferably less than 20 ppm, and more preferably less than 10 ppm of dissolved total metals, except for tin and zinc.

As metals in solution are generally discouraged, it is preferred that those non-metal-containing oxidizers that are typically present in salt forms, for example persulfates, are in the acid form and/or in the ammonium salt form, such as ammonium persulfate.

Other stabilizers include free radical quenchers. As discussed, these will impair the utility of the free radicals produced. Therefore, it is preferred that if present they are present in small quantities. Most antioxidants, i.e., vitamin B, vitamin C, citric acid, and the like, are free radical quenchers. Most organic acids are free radical quenchers, but three that are effective and have other beneficial stabilizing properties are phosphonic acid, the binding agent oxalic acid, and the non-radical-scavenging sequestering agent gallic acid.

In addition, it is believed that carbonate and phosphate will bind onto the activator and hinder access of the fluid. Carbonate is particularly useful as it can be used to stabilize a slurry, but a small amount of acid can quickly remove the stabilizing ions. Stabilization agents useful for absorbed activator can be film forming agents forming films on the silica particle.

Suitable stabilizing agents include organic acids, such as adipic acid, phthalic acid, citric acid, malonic acid, orthophthalic acid; and, phosphoric acid; substituted or unsubstituted phosphonic acids, i.e., phosphonate compounds; nitriles; and other ligands, such as those that bind the activator material and thus reduce reactions that degrade the oxidizing agent, and any combination of the foregoing agents. As used herein, an acid stabilizing agent refers to both the acid stabilizer and its conjugate base. That is, the various acid stabilizing agents may also be used in their conjugate form. By way of example, herein, an adipic acid stabilizing agent encompasses adipic acid and/or its conjugate base, a carboxylic acid stabilizing agent encompasses carboxylic acid and/or its conjugate base, carboxylate, and so on for the above mentioned acid stabilizing agents. A suitable stabilizer, used alone or in combination with one or more other stabilizers, decreases the rate at which an oxidizing agent such as hydrogen peroxide decomposes when admixed into the CMP slurry.

On the other hand, the presence of a stabilization agent in the composition may compromise the efficacy of the activator. The amount should be adjusted to match the required stability with the lowest adverse effect on the effectiveness of the CMP system. In general, any of these optional additives should be present in an amount sufficient to substantially stabilize the composition. The necessary amount varies depending on the particular additive selected and the particular make up of the CMP composition, such as the nature of the surface of the abrasive component. If too little of the additive is used, the additive will have little or no effect on the stability of the composition. On the other hand, if too much of the additive is used, the additive may contribute to the formation of undesirable foam and/or flocculant in the composition. Generally, suitable amounts of these optional additives range from about 0.001 to about 2 weight percent relative to the composition, and preferably from about 0.001 to about 1 weight percent. These optional additives may be added directly to the composition or applied to the surface of the abrasive component of the composition.

In the certain embodiments comprising activator compounds attached to solid surface, stabilization compound may not be required to prevent degradation of the oxidizer once it is added to the slurry.

Surfactants

If a surfactant is added to the CMP slurry, then it may be an anionic, cationic, nonionic, zwitterionic surfactant or amphoteric surfactant or a combination of two or more surfactants can be employed.

Various anionic and cationic surfactants having molecular weight in the range from less than 1000 to greater than 30,000 are contemplated as dispersants. Included are lauryl sulfate, alkyl polyphosphate, dodecyl benzene sulfonate, disopropylnaphthalene sulfonate, dioctylsulfosuccinate, ethoxylated and sulfated lauryl alcohol, and ethoxylated and sulfated alkyl phenol.

Various cationic surfactants include polyethyleneimine, ethoxylated fatty amine and stearylbenzyldimethylammonium chloride or nitrate. Alternate dispersants contemplated in the present invention include: polyethylene glycols, lecithin, polyvinyl pyrrolidone, polyoxyethylene, isoctylphenyl ether, polyoxyethylene nonylphenyl ether, amine salts of alkylaryl sulfonates, polyacrylate and related salts, polymethacrylate.

In general, a surfactant that may be used in the CMP slurry should be sufficient to achieve effective stabilization of the slurry and will typically vary depending on the particular surfactant selected and the nature of the surface of the metal oxide abrasive. For example, if not enough of a selected surfactant is used, it will have little or no effect on CMP slurry stabilization. On the other hand, too much surfactant in the CMP slurry may result in undesirable foaming and/or flocculation in the slurry.

It also has been found that the addition of a surfactant may be useful to reduce the within-wafer-non-uniformity (WIWNU) of the wafers, thereby improving the surface of the wafer and reducing wafer defects.

While there are many suitable surfactant additives for the composition, preferred surfactant additives include dodecyl sulfate sodium salt, sodium lauryl sulfate, dodecyl sulfate ammonium salt, and any combination thereof. Suitable commercially available surfactants include TRITON DF 16™ manufactured by Union Carbide and SUIRFYNOL™ manufactured by Air Products and Chemicals.

The surfactant generally is present in the slurry of this invention in an amount ranging from about 0.001% to about 0.2% by weight, and preferably from about 0.001 to about 0.1 weight percent.

Biocide

In certain embodiments, the CMP composition further comprises a biocide. The use of biocide in the enclosed CMP polishing compositions reduces or eliminates bacteria and other microorganisms, especially when the pH values of the CMP polishing compositions is close or around neutral pH conditions.

The biocide ranges from about 0.0001 weight % to about 0.03 weight %.

The disclosed additive may be added directly to the slurry or treated onto the surface of the metal oxide abrasive utilizing known techniques. In either case, the amount of additive is adjusted to achieve the desired concentration in the polishing slurry.

Components of the CMP slurry of invention may be mixed together as a single component slurry or may be provided in two more components to be mixed at point of use. It may be preferable to add an oxidizer at the point of use.

In certain preferred embodiments, the slurry may be provided in a concentrated form so that it can be diluted with water and oxidizer be added prior to use. The slurry may be concentrated so that water that can be added at the point of use is preferably 2 times the volume of the slurry or more preferably more than 3 times the volume of the slurry or most preferably more than 5 times the volume of the slurry.

WORKING EXAMPLES

General Experimental Procedure

Parameters:
Å: angstrom(s)—a unit of length
BP: back pressure, in psi units
CMP: chemical mechanical planarization=chemical mechanical polishing
DF: Down force: pressure applied during CMP, units psi
min: minute(s)
ml: milliliter(s)
mV: millivolt(s)
psi: pounds per square inch
PS: platen rotational speed of polishing tool, in rpm (revolution(s) per minute)
SF: polishing composition flow, ml/min TEOS silicon oxide films by Chemical Vapor Deposition (CVD) using tetraethylk rthosilicate as the precursor Removal Rate(RR)=(film thickness before polishing−film thickness after polishing)/polish time.

All concentrations of components are wt. % unless otherwise indicated.

In the examples presented below, CMP experiments were run using the procedures and experimental conditions given below.

The CMP tool that was used in the examples is a Mirra®, manufactured by Applied Materials, 3050 Boweres Avenue, Santa Clara, Calif., 95054. Polishing Pad IC1010 pad, supplied by Dow Corporation was used for CMP process.

200 mm diameter silicon wafers coated with tungsten films TEOS films or tungsten containing MIT 854 patterned structures were used. Polish time for blanket films was one minute. Tungsten removal rates were measured using sheet resistance measurement techniques. TEOS removal was measured using optical techniques. Patterned wafers were polished for time based on optical end point technique on the Mirra polisher. Polishing time for patterned wafer was 30 seconds past the end point identified by the optical end point technique. Patterned wafers were analyzed with a KLA Tencor P15 Profiler (large feature sizes) or an AFM tool (small feature sizes).

The polishing was performed at 4.0 psi down force, 120 RMP table speed and 120 ml/min slurry flow rate, unless stated otherwise.

Any listed pH adjuster, such as ammonium hydroxide or nitric acid could be used to adjust the pH of the compositions. A biocide could also be used as needed.

Activator particles used in the compositions were made by an iron compound coating process on colloidal silica particles. Methods described in the published patents U.S. Pat. Nos. 7,029,508; 7,014,669; 7,427,305; 7,077,880; and 7,429,338; the contents of which are hereby incorporated by reference as if set forth in their entireties.

Example 1

The base compositions (or slurries) with different pH were made as per composition listed in table I.

All base compositions comprised 0.125 wt. % colloidal silica particles (particle size ~160 nm), 0.0945 wt. % activator particles, and 3.5 wt. % hydrogen peroxide. Particle size of colloidal silica abrasive particles and activator particles were approximately 45 nm as measured by dynamic light scattering.

Tungsten and TEOS blanket films and a patterned tungsten film were polished on Mirra polisher at 4 psi membrane and 120 RPM table speed with 120 ml/min flow rate.

Figure 2:
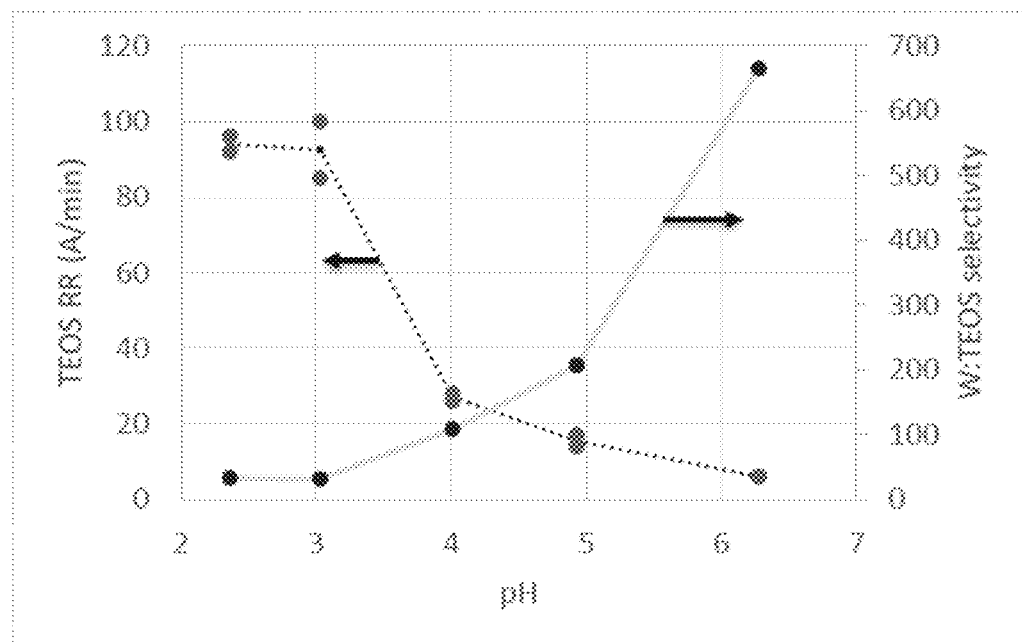
FIG. 2 shows TEOS removal rate and W to TEOS removal rate selectivity as a function of slurry pH after hydrogen peroxide addition

TEOS removal rates and tungsten to TEOS removal rate selectivity as a function of pH after hydrogen peroxide addition were plotted in FIG. 2.

It can be seen that the TEOS removal reduced sharply at pH>4. TEOS removal rates were extremely low (<20 Angstroms/min) when the slurry pH was at 6.28.

At such low removal rates, it would be expected that the TEOS in the patterned structure would also be polished at very slow rates. Hence the erosion of dense array structures would be expected to be minimal.

TABLE 1

| | Composition | | | | |
|---|---|---|---|---|---|
| | 1 | 2 | 3 | 4 | 5 |
| Activator Particle (wt. %) | 0.0945 | 0.0945 | 0.0945 | 0.0945 | 0.0945 |
| Colloidal silica (wt. %) | 0.125 | 0.125 | 0.125 | 0.125 | 0.125 |
| pH before $H_2O_2$ addition | 7.7 | 5 | 4 | 3 | 2.3 |
| $H_2O_2$ (wt. %) | 3.5 | 3.5 | 3.5 | 3.5 | 3.5 |
| pH after $H_2O_2$ addition | 6.28 | 4.93 | 4.01 | 3.03 | 2.36 |

Table 2 listed the erosion topography measured on different patterned structures on patterned wafer polished with composition 1 listed in Table 1.

TABLE 2

| Tungsten Line Width (Micron) | TEOS Line Width | Patten Density (%) | Erosion (Å) |
|---|---|---|---|
| 2 | 2 | 50 | 110 |
| 5 | 5 | 50 | 71 |
| 7 | 3 | 70 | 248 |
| 9 | 1 | 90 | 815 |

From table 2, it is evident that the erosion increases as pattern density increases and as the TEOS line width shrinks.

9×1 micron array erosion was very high. Based on blanket TEOS removal rates of less than 20 Å/min, it is very difficult to understand how the 1 micron wide TEOS line would erode 815 Å.

Example 2

To 100 gm of formulation of composition 1, 0.5 gm tungsten powder with 325 mesh particle (obtained from Alfa Aesar, 2 Radcliff Rd, Tewksbury, Mass. 01876) was added at room temperature. The pH was measured before the addition of tungsten powder. The stabilized pH was also measured after the addition of tungsten powder, such as 1 hour. Slurry was being stirred during the whole process. With the addition of tungsten powder the pH decreased from 6.62 to 2.54.

This clearly shows that tungsten in solution reduces the pH.

So, while the slurry was made at pH 6.68, the actual pH of the slurry under polishing conditions may be much lower than that. As a result, the TEOS lines on the patterned structure especially with high metal pattern density would be polished at much higher removal rates than what could be predicted based on the TEOS blanket removal rates.

Example 3

Compositions were made as shown listed in table 3. The compositions were made with adding different additives to a same base composition as used in Example 1.

pH was adjusted to the specified value before hydrogen peroxide($H_2O_2$) addition using ammonium hydroxide or nitric acid.

The pH was then measured after the addition of hydrogen peroxide.

TABLE 3

| Composition | Additive | Additive Conc (wt. %) | pH Before $H_2O_2$ added | pH After $H_2O_2$ added | pH 1 hour after W powder added |
|---|---|---|---|---|---|
| 6 | Ammonia | <0.01 | 7.7 | 6.79 | 2.07 |
| 7 | Citric Acid | 0.05 | 7.7 | 7.33 | 2.31 |
| 8 | Citric Acid | 0.1 | 7.7 | 7.43 | 5.27 |
| 9 | Citric Acid | 0.2 | 7.7 | 7.46 | 5.92 |
| 10 | EDTA | 0.05 | 7.7 | 7.37 | 4.15 |
| 11 | EDTA | 0.1 | 7.7 | 7.46 | 5.39 |
| 12 | EDTA | 0.2 | 7.7 | 7.54 | 5.89 |
| 13 | Ammonia | 0.0185 | 10 | 8.86 | 6.73 |
| 14 | Ammonia | 0.285 | 11 | 9.74 | 9.53 |

TABLE 4

| Composition | pH 1 hour after W powder addition | 9X1 micron Array Erosion (Å) | Blanket Tungsten Removal Rate (Angstroms/min) | Blanket TEOS Removal Rate (Angstroms/min) |
|---|---|---|---|---|
| 6 | 2.07 | 693 | 5911 | 56 |
| 7 | 2.31 | 572 | 2413 | 0 |
| 8 | 5.27 | 255 | 1016 | 20 |
| 9 | 5.92 | 121 | 1119 | 22 |
| 10 | 4.15 | 522 | 3072 | 6 |
| 11 | 5.39 | 338 | 1634 | 48 |
| 12 | 5.89 | 124 | 1491 | 0 |
| 13 | 6.73 | 424 | 7158 | 0 |
| 14 | 9.53 | 3 | 3046 | 7 |

To 100 gm of the composition 1, 0.5 gm tungsten powder with 325 mesh particle (obtained from Alfa Aesar, 2 Radcliff Rd, Tewksbury, Mass. 01876) was added at room temperature.

The pH was then measured after the addition of tungsten powder, such as after 1 hour.

The removal rates of the blanket films and erosion of 9×1 micron array were summarized in Table 4.

It is evident from table 4 that the erosion is greatly reduced for slurries with pH greater than 4 after tungsten powder addition.

Figure 3:
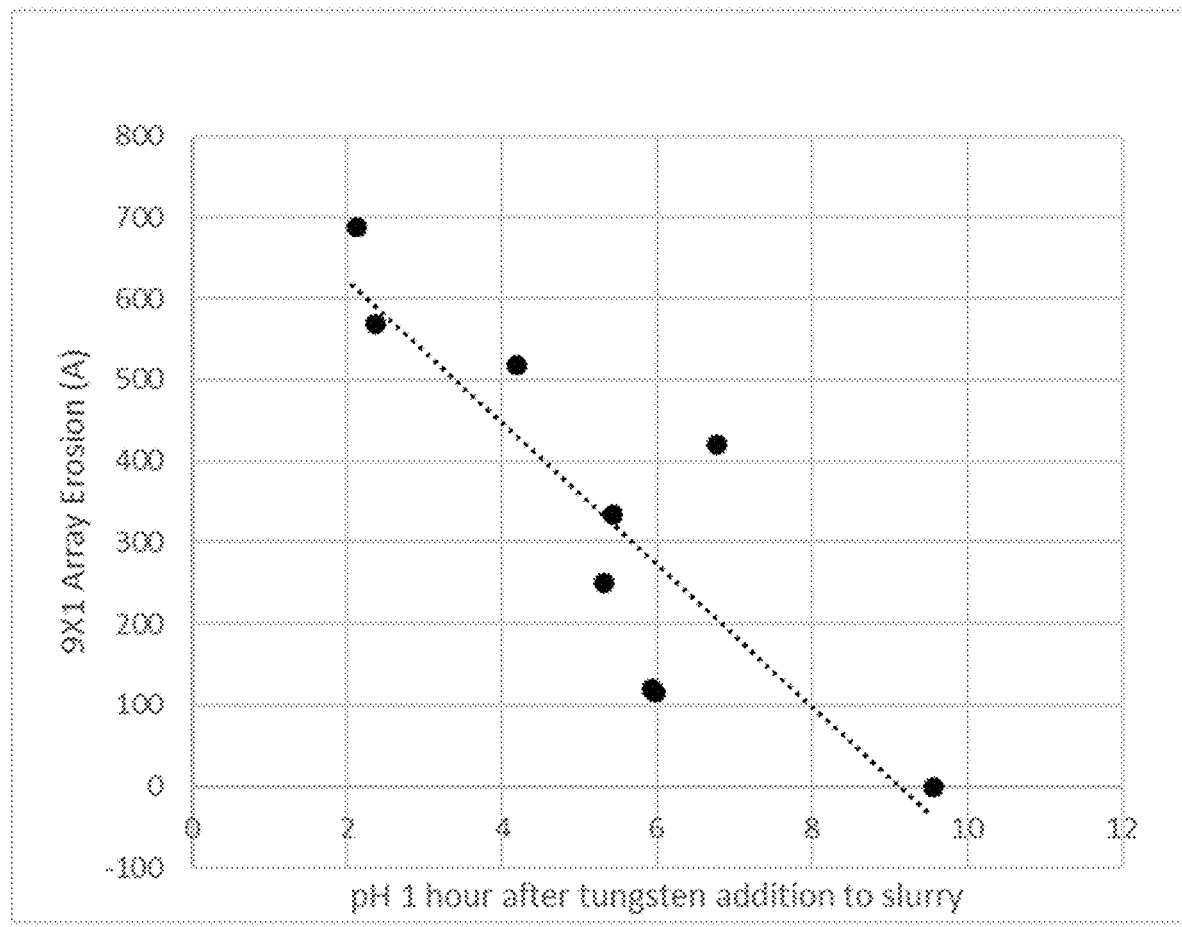
FIG. 3 shows 9×1 micron (μm) array erosion as function of slurry pH 1 hour after tungsten powder is added to the slurry

FIG. 3 shows erosion of 9×1 micron array as a function of pH of the slurry after the tungsten powder addition. It is clearly show that as the slurry pH after tungsten powder addition increases, the erosion decreases.

Example 4

Polishing compositions were made as per the table 5.

These compositions used water soluble iron compounds (purchased from Sigma Aldrich) as activators at 0.01 wt. % concentration.

The compositions also comprised 0.2 wt. % colloidal silica with particle size of approximately 60 nm and 3.5 wt. % hydrogen peroxide.

pH of the formulations was adjusted to 7.7 prior to hydrogen peroxide addition.

To 100 gm of slurry, 0.5 gm of tungsten powder was added with slurry being constantly stirred.

pH was then measured 1 hour after the tungsten powder addition

The results in Table 5 showed that with the water soluble catalysts, the pH after tungsten powder addition can be still maintained above 4 as with the solid catalysts, indicating that these formulations can also yield superior erosion performance.

Comparative examples 19 and 20 containing gluconic acid which has pKa of 3.86.

TABLE 5

| Composition | Additive | Additive Conc (wt. %) | Activator | pH after hydrogen peroxide addition | pH 1 hour after W powder added |
|---|---|---|---|---|---|
| 15 | Citric Acid | 0.1 | Ammonium iron (III) Citrate | 7.32 | 5.1 |
| 16 | Citric Acid | 0.2 | Ammonium iron (III) Citrate | 7.36 | 5.81 |
| 17 | Citric Acid | 0.1 | Ammonium iron (III) Oxalate trihydrate | 7.39 | 5.12 |
| 18 | Citric Acid | 0.2 | Ammonium iron (III) Oxalate trihydrate | 7.48 | 5.88 |
| 19 (Comparative) | Gluconic acid | 0.1 | Gluconic acid Iron (II) Hydrate | 6.23 | 3.98 |
| 20 (Comparative) | Gluconic acid | 0.2 | Gluconic acid Iron (II) Hydrate | 6.16 | 3.85 |

It's evident from the results in Table 5 that gluconic acid with pKA<4 does not provide high enough pH after tungsten powder addition, indicating that these formulations may not provide sufficient reduction in erosion of tungsten line structures.

The foregoing examples and description of the embodiments should be taken as illustrating, rather than as limiting the present invention as defined by the claims. As will be readily appreciated, numerous variations and combinations of the features set forth above can be utilized without departing from the present invention as set forth in the claims. Such variations are not regarded as a departure from the spirit and scope of the invention, and all such variations are intended to be included within the scope of the following claims.

The invention claimed is:

1. A tungsten chemical mechanical polishing (CMP) polishing composition for reduced oxide erosion, consisting of:
0.001 wt. % to 30 wt. % particles;
0.05 wt. % to 10 wt. % at least one oxidizing agent;
0.0005 wt. % to 10 wt. % activator;
≥0.01 wt. % erosion reducing agent having at least one functional group with pKa equal and greater than (≥) 4; and
water;
optionally at least one of:
0.0001 wt. % to 5 wt. % pH adjusting agent selected from the group consisting of amines, ammonium hydroxide, nitric acid, phosphoric acid, sulfuric acid, organic acids, salts thereof, and combinations thereof;
biocide;
surfactants selected from the group consisting of dodecyl sulfate sodium salt, sodium lauryl sulfate, dodecyl sulfate ammonium salt, and any combination thereof; and;
dishing reducing agents selected from the group consisting of sarcosinates and hydrocarbon substituted sarcosinate; oxazolidines or mixtures of functional groups in one compound; nitrogen containing compounds having three or more carbon atoms that form alkylammonium ions; amino alkyls having three or more carbon atoms; polycationic amine compounds; cyclodextrin compounds; polyethyleimine compounds; chitosan; sugar alcohols; polysaccharides; phosphonium compounds; sulfonic acid polymers; and combinations thereof;
wherein pH of the chemical mechanical polishing (CMP) polishing composition is maintained from 4 to 11 during polishing.

2. The tungsten chemical mechanical polishing (CMP) polishing composition of claim 1, wherein the erosion reducing agent has a concentration of ≥0.05 wt. % and has at least two functional groups with pKa equal and greater than (≥) 4.

3. The tungsten chemical mechanical polishing (CMP) polishing composition of claim 1 wherein the erosion reducing agent has a concentration of ≥0.05 wt. %, and pH of the chemical mechanical polishing (CMP) polishing composition is maintained from 5 to 11 during polishing.

4. The tungsten chemical mechanical polishing (CMP) polishing composition of claim 1, wherein the erosion reducing agent is selected from the group consisting of ammonium hydroxide, potassium hydroxide, sodium hydroxide, cesium hydroxide, potassium silicate, quaternary ammonium hydroxide, primary amine compound, secondary amine compound, tertiary amine compound, alcohol amines, polyacrylic acid, citric acid, acetic acid, carbonic acid, Tris, 4-(2-hydroxyethyl)-1-piperazineethanesulfonic acid, N-cyclohexyl-3-aminopropanesulfonic acid, 3-(N-morpholino)propanesulfonic acid, and piperazine-N,N'-bis(2-ethanesulfonic acid), taurine, acetic acid, acrylic acid, propanoic acid, amino acid selected from the group consisting of glycine, bicine, and tricine, succinic acid, tartaric acid, creatinine, asparagine, pyrollidone, morpholine, piperazine, pyridine, uric acid, itaconic acid, choline, 3,4-Dihydroxybenzoic acid, polyamino carboxylic acid, ethylenediaminetetraacetic acid (EDTA), diethylenetriaminepentaacetic acid, ethylene glycol-bis(β-aminoethyl ether)-N,N,N',N'-tetraacetic acid, iminodiacetic acid, and combinations thereof.

5. The tungsten chemical mechanical polishing (CMP) polishing composition of claim 1, wherein the abrasive particles are selected from the group consisting of colloidal silica; fumed silica; alumina; titania; ceria; zirconia; surface modified particles selected from the group consisting of activator-containing particles, composite particles, and lattice doped and inorganic oxide particles; and combinations thereof.

6. The tungsten chemical mechanical polishing (CMP) polishing composition of claim 1, wherein the at least one oxidizing agent is a peroxy compound selected from the group consisting of hydrogen peroxide, urea peroxide, peroxyformic acid, peracetic acid, propaneperoxoic acid, substituted or unsubstituted butaneperoxoic acid, hydroperoxyacetaldehyde, potassium periodate, and ammonium peroxymonosulfate; or a non-per-oxy compound selected from the group consisting of ferric nitrite, $KClO_4$, $KBrO_4$, and $KMnO_4$.

7. The tungsten chemical mechanical polishing (CMP) polishing composition of claim 1, wherein the activator is a metal ion coated particles or metal ion soluble activator.

8. The tungsten chemical mechanical polishing (CMP) polishing composition of claim 1, consisting of:
the abrasive particles selected from the group consisting of colloidal silica, fumed silica, alumina, titania, ceria, zirconia, composite particles, and combinations thereof;
hydrogen peroxide;
metal iron coated particles, metal iron soluble activator, or combinations thereof wherein the metal iron is selected from the group consisting of a ferric salt, a ferrous salt, and a ferric oxide;
ammonium hydroxide, potassium hydroxide, citric acid, ethylenediaminetetraacetic acid (EDTA), or combinations thereof; and
pH of the chemical mechanical polishing (CMP) polishing composition is maintained from 5 to 11 during polishing.

9. A system for chemical mechanical polishing a semiconductor substrate having tungsten(W) film and at least one dielectric material with reduced erosion oxide, comprising:
the semiconductor substrate;
a polishing pad;
a chemical mechanical polishing composition consisting of:
0.001 wt. % to 30 wt. % particles;
0.05 wt. % to 10 wt. % at least one oxidizing agent;
0.0005 wt. % to 10 wt. % activator;
≥0.01 wt. % erosion reducing agent having at least one functional group with pKa equal and greater than (≥) 4;
and
water;
optionally at least one of:
0.0001 wt. % to 5 wt. % pH adjusting agent selected from the group consisting of amines, ammonium hydroxide, nitric acid, phosphoric acid, sulfuric acid, organic acids, salts thereof, and combinations thereof;
biocide;
surfactants selected from the group consisting of dodecyl sulfate sodium salt, sodium lauryl sulfate, dodecyl sulfate ammonium salt, and any combination thereof; and;
dishing reducing agents selected from the group consisting of sarcosinates and hydrocarbon substituted sarcosinate; oxazolidines or mixtures of functional groups in one compound; nitrogen containing compounds having three or more carbon atoms that form alkylammonium ions; amino alkyls having three or more carbon atoms; polycationic amine compounds; cyclodextrin compounds; polyethyleimine compounds; chitosan; sugar alcohols; polysaccharides; phosphonium compounds; sulfonic acid polymers; and combinations thereof;

wherein pH of the chemical mechanical polishing (CMP) polishing composition is maintained from 4 toll during polishing;

wherein at least a portion of the semiconductor substrate having tungsten(W) film and at least one dielectric material are in contact with both the polishing pad and the chemical mechanical polishing composition.

10. The system of claim 9, wherein the dielectric material selected from the group consisting of Tetra Ethyl Ortho Silicate (TEOS), High Density Plasma (HDP) oxide.

11. The system of claim 9, wherein the erosion reducing agent has a concentration of ≥0.05 wt. % and has at least two functional groups with pKa equal and greater than (≥) 4.

12. The system of claim 9, wherein the erosion reducing agent has a concentration of ≥0.05 wt. %, and pH of the chemical mechanical polishing (CMP) polishing composition; is maintained from 4 to 11 during polishing and the erosion reducing agent is selected from the group consisting of ammonium hydroxide, potassium hydroxide, sodium hydroxide, cesium hydroxide, potassium silicate, quaternary ammonium hydroxide, primary amine compound, secondary amine compound, tertiary amine compound, alcohol amines, polyacrylic acid, citric acid, acetic acid, carbonic acid, Tris, 4-(2-hydroxyethyl)-1-piperazineethanesulfonic acid, N-cyclohexyl-3-aminopropanesulfonic acid, 3-(N-morpholino) propanesulfonic acid, and piperazine-N,N'-bis(2-ethanesulfonic acid), taurine, acetic acid, acrylic acid, propanoic acid, glycine, bicine, tricine, succinic acid, tartaric acid, creatinine, asparagine, pyrollidone, morpholine, piperazine, pyridine, uric acid, itaconic acid, choline, 3,4-Dihydroxybenzoic acid, polyamino carboxylic acid, ethylenediaminetetraacetic acid (EDTA), diethylenetriaminepentaacetic acid, ethylene glycol-bis(β-aminoethyl ether)-N,N,N',N'-tetraacetic acid, iminodiacetic acid, and combinations thereof.

13. The system of claim 9, wherein the abrasive particles are selected from the group consisting of colloidal silica; fumed silica; alumina; titania; ceria; zirconia; surface modified particles selected from the group consisting of activator-containing particles, composite particles, and lattice doped and inorganic oxide particles; and combinations thereof.

14. The system of claim 9, wherein the at least one oxidizing agent is a peroxy compound selected from the group consisting of hydrogen peroxide, urea peroxide, peroxyformic acid, peracetic acid, propaneperoxoic acid, substituted or unsubstituted butaneperoxoic acid, hydroperoxyacetaldehyde, potassium periodate, and ammonium peroxymonosulfate; or a non-per-oxy compound selected from the group consisting of ferric nitrite, $KClO_4$, $KBrO_4$, and $KMnO_4$.

15. The system of claim 9, wherein the activator is a metal ion coated particles or metal ion soluble activator.

16. The system of claim 9, wherein the chemical mechanical polishing composition consisting of:

the abrasive particles selected from the group consisting of colloidal silica, fumed silica, alumina, titania, ceria, zirconia, composite particles, and combinations thereof;

hydrogen peroxide;

metal iron coated particles, metal iron soluble activator, or combinations thereof wherein the metal iron is in a form selected from the group consisting of a ferric salt, a ferrous salt, and a ferric oxide;

ammonium hydroxide, potassium hydroxide, citric acid, ethylenediaminetetraacetic acid (EDTA), or combinations thereof; and pH of the chemical mechanical polishing (CMP) polishing composition is maintained from 5 toll during polishing.

* * * * *